United States Patent [19]

Ports et al.

[11] 4,290,831

[45] Sep. 22, 1981

[54] METHOD OF FABRICATING SURFACE CONTACTS FOR BURIED LAYER INTO DIELECTRIC ISOLATED ISLANDS

[75] Inventors: Kenneth A. Ports, Indialantic; William G. Lucas, Indian Harbour Beach, both of Fla.

[73] Assignee: Harris Corporation, Melbourne, Fla.

[21] Appl. No.: 141,504

[22] Filed: Apr. 18, 1980

[51] Int. Cl.³ ............................................. H01L 21/22
[52] U.S. Cl. ................................ 148/187; 29/576 W; 29/578; 148/1.5
[58] Field of Search ............... 148/187, 1.5; 29/578, 29/576 W, 576.1 W

[56] References Cited

U.S. PATENT DOCUMENTS

| | | | |
|---|---|---|---|
| 3,722,079 | 3/1973 | Beasom | 148/187 X |
| 3,815,222 | 6/1974 | Mitarai et al. | 29/578 |
| 3,858,237 | 12/1974 | Sawazaki et al. | 357/49 |
| 3,865,649 | 2/1975 | Beasom | 148/175 X |
| 3,938,176 | 2/1976 | Sloan | 357/49 |
| 4,146,905 | 3/1979 | Appels et al. | 357/44 |

*Primary Examiner*—G. Ozaki
*Attorney, Agent, or Firm*—Leitner, Palan, Martin & Bernstein

[57] ABSTRACT

Low resistance contact paths to selected buried layers in dielectrically isolated islands are formed by V-etching the selected island moats in a substrate, non-selectively diffusing impurities into the surface of the substrate and selected moats, V-etching to form all the moat structure, forming a dielectric layer on said surface and moats, applying support material to over-fill said moats and cover said surface, removing the opposite surface of said substrate to expose support material, and forming devices in said opposite surface.

6 Claims, 6 Drawing Figures

METHOD OF FABRICATING SURFACE CONTACTS FOR BURIED LAYER INTO DIELECTRIC ISOLATED ISLANDS

BACKGROUND OF THE INVENTION

The present invention relates generally to dielectrically isolated integrated circuits, and more specifically, to an improved contact for the buried layer in dielectrically isolated integrated circuits.

In standard dielectric isolation processing, a buried N+ layer is often added by nonselectively or selectively introducing impurities into the surface of a single crystal substrate which is then moat etched to define the islands and later covered with a dielectric layer and support material. Once the other side of the substrate is removed to expose single crystal islands embedded in the support material, devices are formed within the dielectrically isolated substrate islands. To provide a low resistive path to the buried layer, impurities must be diffused from the now front-side surface down into the buried layer. Because this diffusion is a deep diffusion requiring a long period of time, the buried layer will substantially up-diffuse during this diffusion. For most circuits, this does not produce any undesirable side effects. However, with the trend in the state of the art to use very thin dielectrically isolated islands, the up-diffusion of the buried region substantially affects the breakdown voltage of the device. Thus, it has been suggested to form the thin dielectric isolated islands without the buried layer. This substantially increases the collector resistance and may be undesirable for some circuit elements, particularly output devices which are required to drive or sink large currents.

One solution to this problem is to form low resistive regions along the side walls of the tub extending up from the buried layer. Typical examples are shown in U.S. Pat. Nos. 3,858,237; 3,938,176 and 4,146,905. Since the side walls are formed generally at the same time as the buried layer, the diffusion is lateral to the surface, and consequently does not require an extensive diffusion cycle time. Since the base diffusion must be kept a minimum distance of about 6 microns from the buried layer and the side wall low resistive path, the size of each of the dielectrically isolated regions must be increased in all directions. Although this solution provides a low resistive path to the buried region, it also adds several microns to each side of each island. This would render this approach inappropriate for use in high density circuits, for example dielectrically isolated RAMS.

Thus, there exists a need for forming low resistive paths to buried collector regions which may be used in high density circuits without diffusing down from the front surface.

SUMMARY OF THE INVENTION

An object of the present invention is to provide a high density integrated circuit with low resistive paths to buried layers in a dielectrically isolated island.

Another object of the present invention is to minimize the amount of surface area used in high density dielectrically isolated integrated circuits having low resistive paths to buried layers which is compatible with thin dielectrically isolated regions.

An even further object of the present invention is to provide a method of fabricating buried layers and low resistive paths thereto with minimum steps and modification of previous fabrication processes.

Still an even further object is to provide a method of fabricating dielectrically isolated islands having buried layers and low resistive contacts thereto which is readily customized to any high density circuit layout.

These and other objects of the invention are attained by selectively forming low resistive side wall regions simultaneously with the formation of the buried region during the dielectric isolation segment of the process for those dielectric isolated regions needing a low resistive contact or path to the buried layer and by not forming the low resistance side walls for other dielectrically isolated regions, thereby decreasing circuit size. The formation of these regions during buried region formation reduces the number of steps and the selectivity reduces the surface area required to incorporate the principles of the present invention. The method of fabrication begins with V-etching a first surface of a semiconductor substrate for those selected islands which require low resistive contacts to a buried region. Impurities are then non-selectively diffused into this first surface of the substrate and the selected V-moats. Next, the first surface is again V-etched to form the complete moat structure which delineates the to be formed dielectrically isolated regions. The selected V moat etching mask is undersized compared to the second V moat etching mask to allow V-etching during the second etching step of all moat regions to assure uniformity of depth. A layer of dielectric material is formed on the first surface and in the moat structure which is then filled with support material to over-fill the moats, cover the first surface of the substrate and form a support structure. A second surface opposite the first surface of the substrate is removed to a depth sufficient to expose the support material and form the dielectrically isolated regions. Devices are then formed in the second surface of the dielectrically isolated regions.

Other objects, advantages, and novel features of the present invention will become apparent from the following detailed description of the invention when considered in conjunction with the accompanying drawings.

DESCRIPTION OF THE PREFERRED EMBODIMENTS

To minimize the use of surface space and thereby increase the density of dielectrically isolated integrated circuits, the present invention forms low resistive side wall regions for selected dielectrically isolated regions or tubs. Thus, only for those tubs is the size of the dielectrically isolated region increased. The selectivity of the dielectrically isolation region which will have the low resistive side walls are those which require low resistive contact to the buried region. For example, in a RAM integrated circuit, a low resistive contact to the buried collector region is not needed in the cell devices themselves, and consequently, low resistive side walls need not be provided for these dielectrically isolated regions. For the high current output devices of a RAM integrated circuit, low resistive side walls will be provided to reduce the collector resistance.

Figure 1:
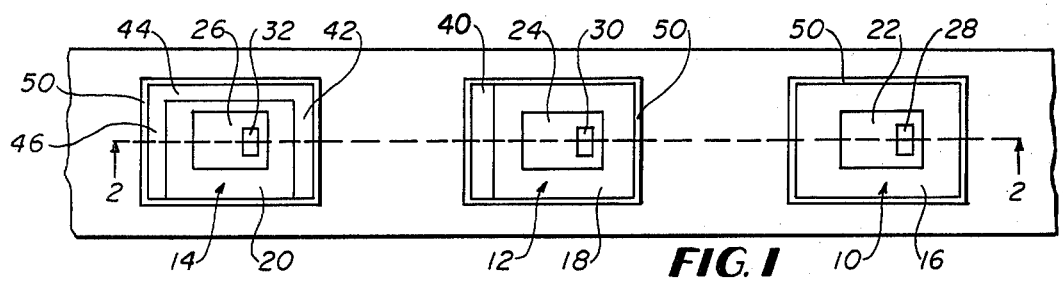
FIG. 1 is a topological view of an integrated circuit incorporating the principles of the present invention.
Figure 2:
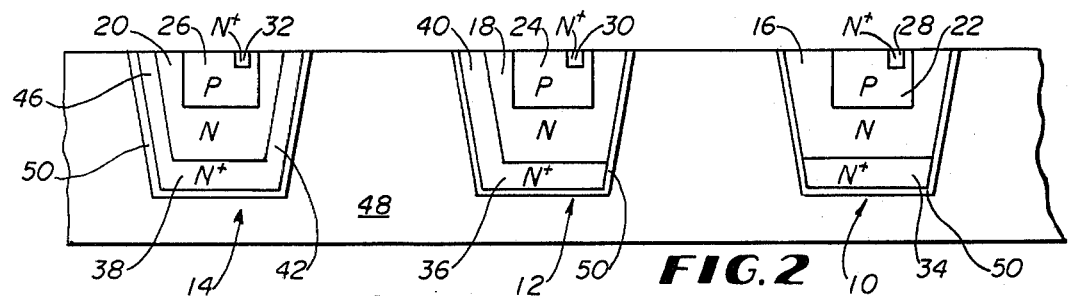
FIG. 2 is a cross-sectional view taken along lines II—II of FIG. 1.

A portion of a typical integrated circuit incorporating the principles of the present invention is illustrated in FIGS. 1 and 2 as including three dielectrically isolated regions 10, 12 and 14 having bipolar transistors formed therein. The dielectrically isolated regions 10, 12 and 14 are separated from the support material 48 by a dielectric layer 50. The bipolar transistors include collector regions 16, 18, 20, base regions 22, 24, 26, and emitter regions 28, 30, and 32 for the dielectrically isolated regions 10, 12 and 14, respectively. A low resistive, high impurity concentration buried region 34, 36, and 38 is formed in the bottom of dielectrically isolated regions 10, 12, and 14, respectively. To illustrate the selectivity of providing low resistive contacts to the buried regions, dielectrically isolated device 10 has no low resistive contact to the buried region 34, dielectrically isolated region 12 has a single side wall 40 providing a low resistive contact to buried region 36 and dielectrically isolated region 14 includes three side walls 42, 44, and 46 providing a low resistive contact to buried region 38. Although the emitter, collector, buried layer, and side wall regions are illustrated as N conductivity type and the base regions as P conductivity type to form NPN transistors, these are by way of example, and the conductivity types may be reversed to form PNP transistors. Similarly, the illustrated embodiments having none, one or three walls are but illustrations of various combinations of low resistive side walls which may be provided. Obviously, two or four walls may be provided if desired.

It should be observed that since dielectrically isolated region 10 does not include any side wall portions, the collector 16 may be formed having a smaller lateral area than the collector regions 18 and 20 of dielectrically isolated regions 12 and 14, respectively. Similarly, collector region 18 has a single high impurity, low resistive side wall 40 whose lateral area is greater than that of collector 16, but smaller than that of collector 20 which has three high impurity, low resistive side walls. The variation in the lateral area of the collectors is needed to provide sufficient separation between the base regions and the low resistive, high impurity side walls. Otherwise, the electrical characteristics of the device will be unacceptable.

Figure 3:
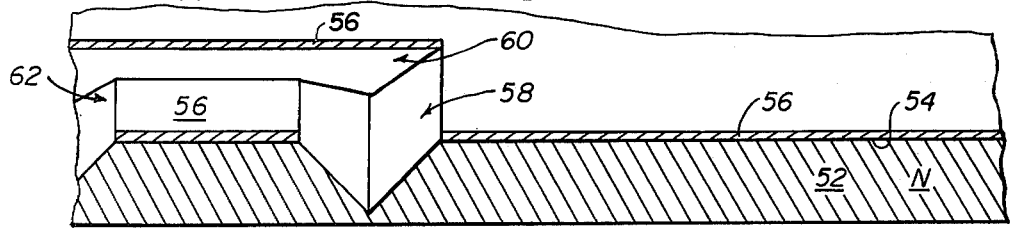
FIG. 3 is a perspective cross-sectional view illustrating an integrated circuit at one stage of fabrication of the integrated circuit of FIGS. 1 and 2 according to the principles of the present invention.

The method of fabrication according to the principles of the present invention begins as illustrated in FIG. 3 with a substrate 52 having a top surface 54. By way of example, the substrate 52 may be an N conductivity type single crystal silicon slice having a resistivity of approximately 0.2 ohm-centimeters and a thickness of 25 mils. The planar surface 54 is cut to have a crystal orientation in the [100] plane. A mask layer 56 is formed on the surface of substrate 52 to expose the area in which side walls of pre-selected to be formed dielectrically isolated regions. By way of example, the mask material 56 may be a silicon oxide which is delineated by applying a photo resist material thereon, exposing the photo resist to define the mask pattern, and etching the silicon oxide with, for example, hydrofluoric acid to form the mask pattern. The photo resist material is then stripped. Next, the exposed surface 54 of the substrate 52 is etched with, for example, potassium hydroxide etchant to provide preselected moat regions 58, 60 and 62. Since the surface 54 has a crystal orientation of [100], a V-moat results of a depth which is a function of the area of surface 54 which is exposed by the mask. The resulting structure is illustrated in FIG. 3.

Figure 4:
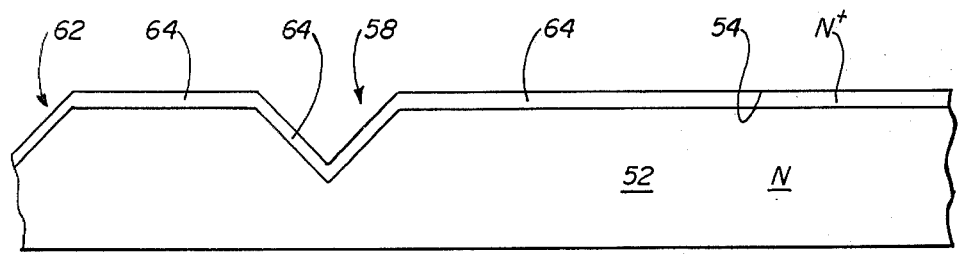
FIGS. 4 through 6 are cross-sectional views at various stages of fabrication of the integrated circuit of FIG. 1 and incorporating the principles of the present invention.

The masked oxide layer 56 is stripped by, for example, hydrofluoric acid and N-type impurities, for example, arsenic, are non-selectively diffused into surface 54 and moat regions 58, 60, and 62 of substrate 52 to form an N-type layer having a sheet resistance of approximately 30 ohms per square and a junction depth of approximately 1.5 microns. This is illustrated in FIG. 4 as N+ layer 64.

Figure 5:
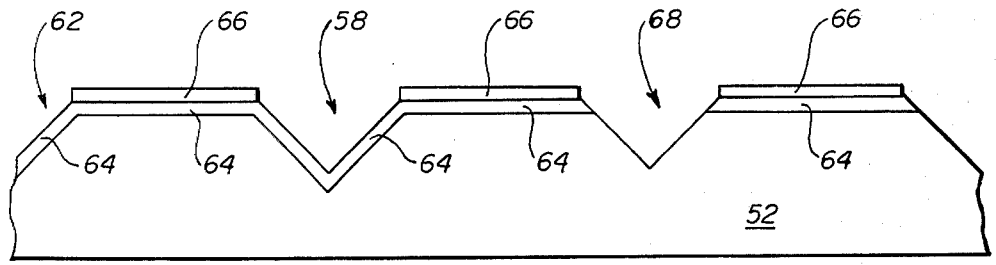

Next, the surface 54 is again coated with a masking material 66, for example, silicon oxide and delineated using the photo resist process described above to define the moat structure for all the to be formed dielectrically isolated regions of substrate 52. The exposed regions of surface area 54 are etched to form the V-moat. It should be noted that the original moats 58, 60 and 62 are formed by an undersized mask compared to the openings in mask layer 60. Thus, in addition to forming the moats 68, moats 58, 60 and 62 are again etched. Since they are etched to a slightly greater depth than the original etching, all the moats V-out at the same depth to assure uniformity of the islands. The depth of the diffused side walls 58 is sufficiently great such that the additional etching does not diminish the thickness of sidewall N+ layer 64 sufficiently to reduce the effective resistance. Whereas the original depth of V moats 58, 60 and 62 were 10 microns, the new depth as illustrated in FIG. 5 is 12 microns. The resulting structure forms a high impurity concentration region at the top surface 54 with side walls along the appropriate pre-selected moat regions.

Figure 6:
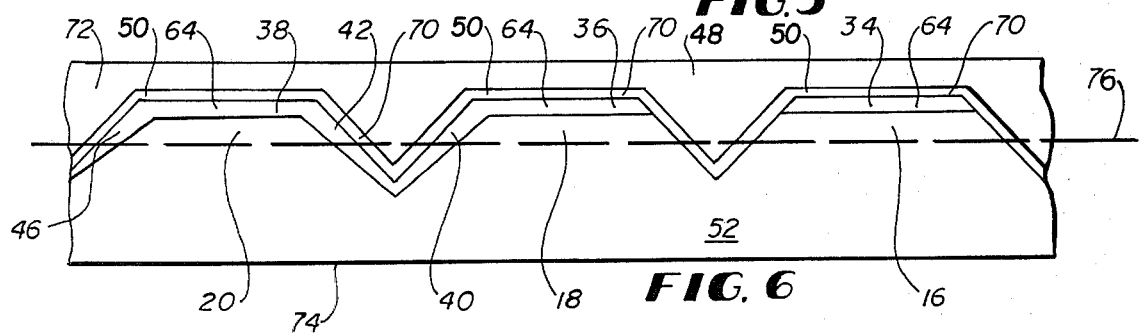

The masking oxide 66 is stripped by hydrofluoric acid and the slice is oxidized to form a 2 micron layer of silicon dioxide 70 over the etched faces of the substrate 52 and surface 54. The silicon dioxide layer 70 becomes the dielectric isolation layer 50 of the completed integrated circuit. A support material is then applied, for example, polycrystalline silicon may be epitaxially deposited on the oxide layer 70. This over-fills the moat regions and forms a support structure 72 which becomes the support structure 48 of FIGS. 1 and 2. The other surface 74 of the substrate 52 is lapped and polished until the polishing plane intersects the etched isolation pattern to expose the fill material 72. The final polishing plane is illustrated as dash lines 76 in FIG. 6. The slice is then inverted and active devices are formed in the dielectrically isolated regions of substrate 52. This results in the structure shown in FIGS. 1 and 2.

As can be seen by the above described process, selectivity and versatility of the present process and resulting structure is accomplished by providing one additional masking step to a standard dielectric isolation process. The second masking step and etch is part of the standard dielectric isolation process. Similarly, the introduction of impurities to form the buried region which also forms the high impurity, low resistive side wall regions is also part of the standard dielectric isolation process.

As is evident from the processes as illustrated in FIGS. 3 through 6, the resulting structure of any preselected moat section also forms a side wall in an adjacent island. Thus, even if it is not desired to have a low resistive contact or path to buried layer 36 is dielectrically isolation region 12, the low resistive side wall 40 is still provided. Connection to the collector region 18 may be directly thereto instead of through the low resistive side wall 40.

From the preceding description of the preferred embodiments, it is evident that the objects of the invention are attained in that a method is provided to fabricate high density, dielectrically isolated regions in an integrated circuit having a low resistive contact to a buried region. Although the invention has been described and illustrated in detail, it is clearly understood that the same is by way of illustration and example only, and is not to be taken by way of limitation. Although an NPN bipolar transistor has been formed with a buried N region and side walls, the polarities of the devices may be reversed. The spirit and scope of the invention are to be limited only by the terms of the appended claims.

What is claimed:

1. A method of fabricating an integrated circuit having a plurality of dielectrically isolated islands comprising:
   etching a first surface of a substrate to form preselected portions of an isolation moat structure of preselected to be formed substrate islands using a first mask exposing said preselected portions;
   non-selectively introducing impurities into said first surface and said preselected portions of said moat to form a low resistive region along said first surface and along said preselected portions of said moat;
   etching said first surface to form a uniform isolation moat structure using a mask exposing the total isolation moat structure including said preselected portions;
   forming a dielectric layer along said first surface and said moat structure;
   covering said dielectric layer with material which over fills said moat and forms a support structure;
   reducing the thickness of said substrate from a second surface opposite said first surface sufficiently to expose portions of said support structure in said moat and form isolated substrate islands; and
   forming devices in said second surface of said substrate islands, said low resistive regions along said preselected island's wall forming a low resistive path to the buried low resistive region at said first surface of said preselected islands.

2. The method according to claim 1 wherein said first surface of said substrate has a [100] crystal orientation and said etching steps are performed until they V-out.

3. The method according to claim 1 wherein said first mask is formed to have apertures undersized compared to the apertures in said second mask.

4. The method according to claim 3 wherein said impurities are introduced into said surface of said preselected moat portions a sufficient depth to assure a low resistive layer along the moat structure after said second mentioned etching step.

5. The method according to claim 1 wherein said impurities introduced are of the same conductivity type as said substrate.

6. The method according to claim 1 wherein said impurities introduced are of the opposite conductivity type as said substrate.

* * * * *